United States Patent [19]

Newton et al.

[11] B 3,982,192
[45] Sept. 21, 1976

[54] MINIPOWERED OPTIONAL SELF CHECKING ELECTRONIC TIMER FOR ORDNANCE

[75] Inventors: John E. Newton, East Aurora, N.Y.; Maxine Bohacz, Boonton; Jerry H. Lyon, Stanhope, both of N.J.

[73] Assignee: The United States of America as represented by the Secretary of the Army, Washington, D.C.

[22] Filed: Sept. 3, 1970

[21] Appl. No.: 78,315

[44] Published under the second Trial Voluntary Protest Program on February 10, 1976 as document No. B 78,315.

[52] U.S. Cl. ............................... 328/129; 307/293
[51] Int. Cl.² .................... H03K 5/13; H03K 5/159
[58] Field of Search .............. 307/223, 293; 328/43, 328/55, 72, 92 T, 92 CP, 129

[56] References Cited
UNITED STATES PATENTS

| | | | |
|---|---|---|---|
| 3,108,228 | 10/1963 | Clapper | 328/43 |
| 3,371,579 | 3/1968 | Kinzelman | 236/92 T |

*Primary Examiner*—Malcolm F. Hubler
*Attorney, Agent, or Firm*—Nathan Edelberg; Max Yarmovsky

[57] ABSTRACT

A digital system is disclosed for providing long time delays. The system includes two interconnected circulating shift registers which are particularly suited for fabrication by integrated circuit techniques. Additional elements in the system are also disclosed for adapting the digital timer for ordnance applications.

9 Claims, 3 Drawing Figures

MINIPOWERED OPTIONAL SELF CHECKING ELECTRONIC TIMER FOR ORDNANCE

The invention described herein may be manufactured, used and licensed by or for the Government for Governmental purposes without the payment to us of any royalties thereon.

FIELD OF THE INVENTION

This invention relates to timers for ordnance applications and particularly to a digital timer for ordnance applications which requires an extremely long time delay.

BACKGROUND OF THE INVENTION

Many ordnance devices such as land mines are equipped with end-of-life timers which serve to detonate the device after a predetermined time interval if some other means of detonation has not occurred. Typically, these timers are set to detonate from hours to days after the mine has been laid. If this feature were not present, it would be necessary to recover and disarm all mines laid or else take the chance that at a future time innocent personnel would be harmed by an inadvertent detonation.

In the past, mechanical timers were employed to perform this function. These timers were not sufficiently accurate or reliable for all deployment situations. They were large and cumbersome and occupied an undue amount of space.

Electronic timing circuits are well known which employ resistors and capacitors to generate delayed signals. Normally, resistor-capacitor time delay circuits are employed when short delays are required. A resistor-capacitor time delay circuit with a delay time of one month would require a capacitor so large that it would be bigger than the rest of the land mine.

Many digital circuits exist for generating delayed signals. Most of these employ binary cells arranged as counters. A particular time delay is achieved by decoding a particular count for providing the time delay signal. These circuits are not the most suitable type for manufacture by integrated circuit techniques.

Therefore, it is an object of this invention to provide an improved digital timer for ordnance applications requiring extremely long time delays.

It is another object of this invention to provide a digital timer which is particularly suited for fabrication by integrated circuit techniques.

It is a further object of this invention to provide a digital timer which provides a choice of output time delays without requiring complicated decoding circuitry.

BRIEF DESCRIPTION OF THE INVENTION

With these and other objects in view, the present invention contemplates a system in which a one bit signal is circulated in a shift register connected as a ring counter. The output from one stage of the shift register is applied to a full binary adder. The sum output from the full binary adder is fed back to a second shift register whose output is applied as a second input to the full binary adder. The carry output from the full binary adder is delayed one bit interval of the shift registers and applied as a third input to the full binary adder. The output from the one bit interval delay is applied to an "And" gate along with an output from a preselected stage of the first shift register. The output from the "And" gate serves as the time delayed signal.

In one embodiment the output from the one bit interval delay circuit is applied to a plurality of "And" gates, each of which is selectively connected to a predetermined stage of the first shift register. In this way, different delay time intervals can be obtained from the time delay circuit.

DETAILED DESCRIPTION OF THE INVENTION

Figure 1:
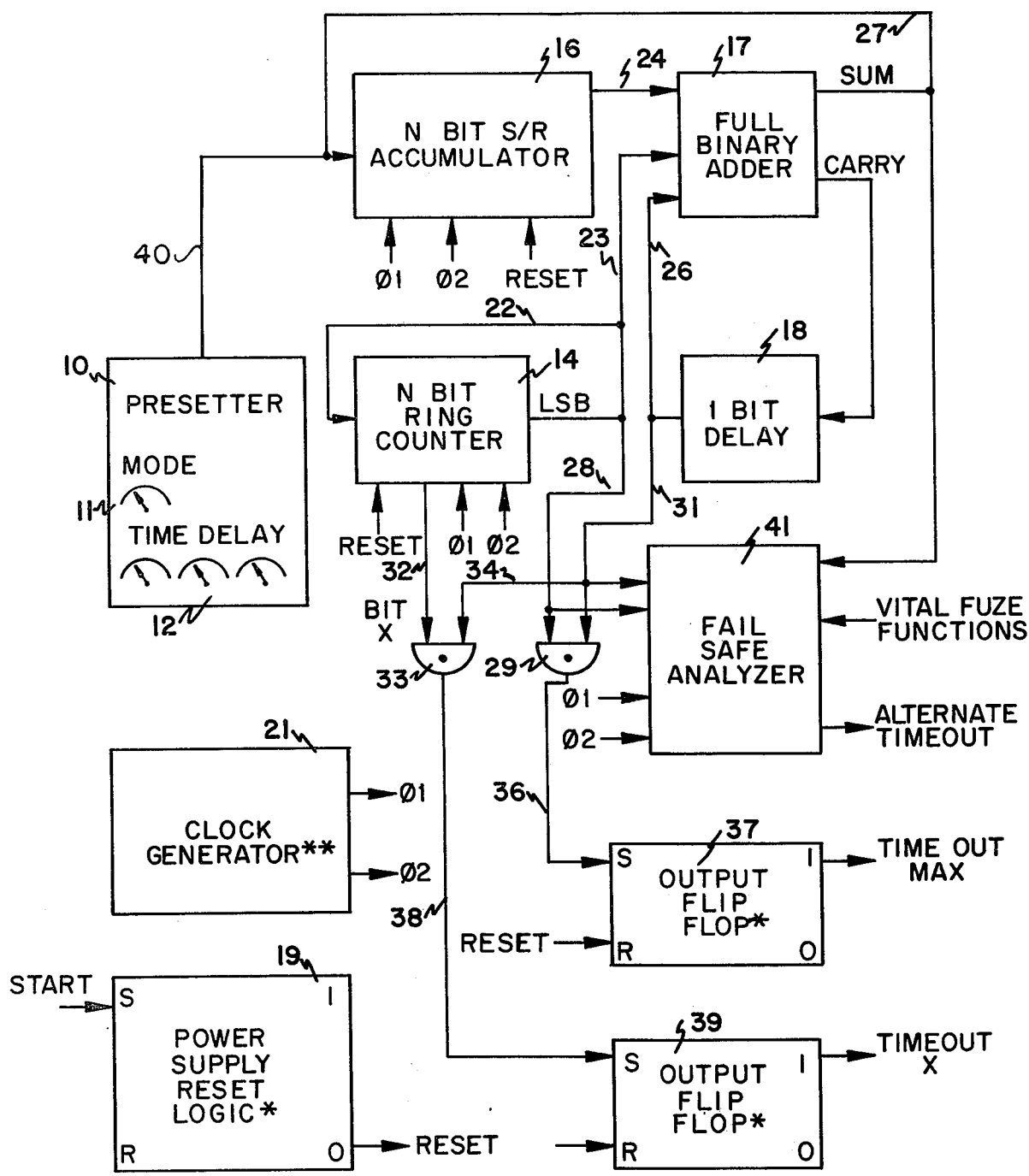
FIG. 1 is a block diagram of a system embodying the principles of this invention.

Referring now to FIG. 1, we see, a rough block diagram of a system embodying the principles of this invention. In the settable version, a presetter panel 10 having a mode select switch 11 (if mode options are available) and a plurality of time delay select switches 12 may be used either directly or through a wireless sensor, such as radio or light transmission means, to select a predetermined time delay in accordance with the switches on the panel 10. In the fixed version, presetter panel 10 is not used.

The basic time delay circuit of this invention includes a first N bit shift register connected as an N bit ring counter 14, a second N bit shift register connected as an N bit shift register accumulator 16, a full binary adder 17, and a one bit interval delay circuit 18.

Presetting is accomplished by applying a coded input signal through lead 40 to N bit shift register accumulator 16 to partially fill the accumulator.

In operation a start signal supplied by a source not shown, is applied to a power supply reset logic flip flop 19 to remove the reset that had been maintaining all of the circuitry in their appropriate states. A two-phase clock generator 21 applies signals $\phi_1$ and $\phi_2$ to the various counting circuits to advance signals in the shift registers 14 and 16 at the clock rate. A two-phase clock is employed because, in the most common low-power techniques the shift registers employed in elements 14 and 16 are two-phase shift registers which are easily manufacturable by integrated circuit techniques. It should be understood, however, that single phase shift registers can also be employed in a system embodying the principles of this invention.

Presetting is accomplished by inhibiting the output of N bit ring counter 14 from entering the full adder 17 while shift register 16 is being preset. As the output of the two-phase clock generator 21 advances the signals in shift register 16, the coded signal present on lead 40 passes into and advances through shift register 16. When N bits have entered shift register 16, the inhibit is removed from the output of N bit ring counter 14. Additional cycles of N bit length may be employed to verify that the correct count was preset into shift register 16.

When the system is energized to start by the power supply reset logic 19, a "1" is present in the least significant stage of the N bit ring counter 14 due to the reset circuitry. As the information therein is advanced to the right, the "1" is passed by a lead 22 back as an input thereto and by a lead 23 as a first input to the full binary adder 17. Since the N bit shift register accumulator 16 initially has all zeros therein (unless it has been previously preset to an initial count), a zero is applied by the lead 24 to the full binary adder 17, and by the lead 26 from the "1" bit delay 18. Therefore, a "1" is supplied on the sum output of the full binary adder 17 which is applied by a lead 27 back as an input to the shift register forming the N bit shift register accumulator 16 while no signal is supplied by the carry output of the full binary adder 17.

Since the "1" was applied by lead 22 as an input to the N bit ring counter 14 at the same time that the "1" was applied by lead 27 as an input to the N bit shift register accumulator 16, they will be advanced by the clock generator 21 in synchronism. As a result, the pulses will arrive at leads 23 and 24 respectively at the same time providing a carry output from the full adder 17 and no sum output therefrom. The "1" provided as an output on lead 23 is recirculated by lead 22 again as an input to the N bit ring counter 14. The carry output from the full binary adder 17 is delayed one bit interval by the one bit delay 18 and applied by the lead 26 as an input to the full binary adder 17. in response to this signal, the full binary adder 17 provides a sum output at lead 27 which is applied as an input to the N bit shift register accumulator 16.

As the single bits in the N bit ring counter 14 and the N bit shift register accumulator 16 now are advanced by the clock generator 21, they are one bit out of phase, so that when the "1" reaches the end of the N bit ring counter 14, it is applied by lead 22 back to the input of N bit ring counter 14 and by lead 23 to be passed by the full binary adder 18 to the sum output and from there by lead 27 back as an input to the N bit shift register accumulator 16. At the next count of the clock generator 21, the "1" which was originally in the N bit shift register accumulator 16 is passed by lead 24 to the full binary adder 17 and from there to the sum output lead 27 and back as a second input to the N bit shift register accumulator 16. Therefore, it is seen that the N bit shift register accumulator 16 now has two "1's" traveling therein, the first "1" in synchronization with the "1" in the N bit shift register 14. Using the "1" in the N bit ring counter 14 as a reference point it is seen that the combination of the N bit ring counter 14, the N bit shift register accumulator 16, the binary full adder 17 and the one bit delay 18 serve as a binary counter, the counted total being accumulated in the N bit shift register accumulator 16 and the reference point being carried by the N bit ring counter 14. It should further be noted that the stages of the N bit shift register accumulator 16 preceding the reference bit in the N bit ring counter 14 are zeros and that they only can become 1's when the number in the N bit shift register accumulator 16 increases to a large enough value to flow back upon itself. Therefore, the full binary adder 17 will not provide a carry output one bit interval before the reference number in the N bit ring counter 14 reaches its last stage until the number stored in the N bit shift register accumulator 16 overflows the counter. In a like manner, a carry will not be provided by the full binary adder 17 one bit interval before the reference "1" in the N bit ring counter 14 reaches its next to its last stage until the N bit shift register accumulator 16 has counted one-half its maximum value.

This realization has been used to advantage by providing "And" gates to monitor the output from the one bit delay 18 and predetermined stages of the N bit ring counter 14. For example, the output from the N bit ring counter 14 is applied by a lead 28 to an "And" gate 29 while the output from the one bit delay 18 is applied by a lead 31 to the "And" gate 29. In a like manner, the output from the $x^{th}$ stage, where "x" is an arbitrary stage of the N bit ring counter 14, is applied by lead 32 to an "And" gate 33 while the output from the one bit delay 18 is applied by a lead 34 to the "And" gate 33. Therefore, when a carry is provided one bit interval prior to the reference bit in the N bit ring counter 14 reaching the last stage, a coincidence will be provided to the "And" gate 29 at the time it actually reaches the last stage because of the one bit delay 18. When "And" gate 29 is satisfied, a signal will be provided by the "And" gate 29 to a lead 36 which operates an output flip flop 37 which triggers a fuze mechanism not shown for detonating the ordnance device. When "And" gate 33 is satisfied, a signal will be provided thereby on a lead 38 to operate the output flip flop 39 triggering some other fuze function (not shown) when the full binary adder 17 provides a carry one bit interval before the reference "1" in the N bit counter 14 reaches the $x^{th}$ stage thereof.

A failsafe analyzer 41 is also included in the system disclosed to insure that upon certain conditions, the ordnance device will be detonated even if the time interval as determined by the presetter panel 10 has not elapsed.

Figure 2:
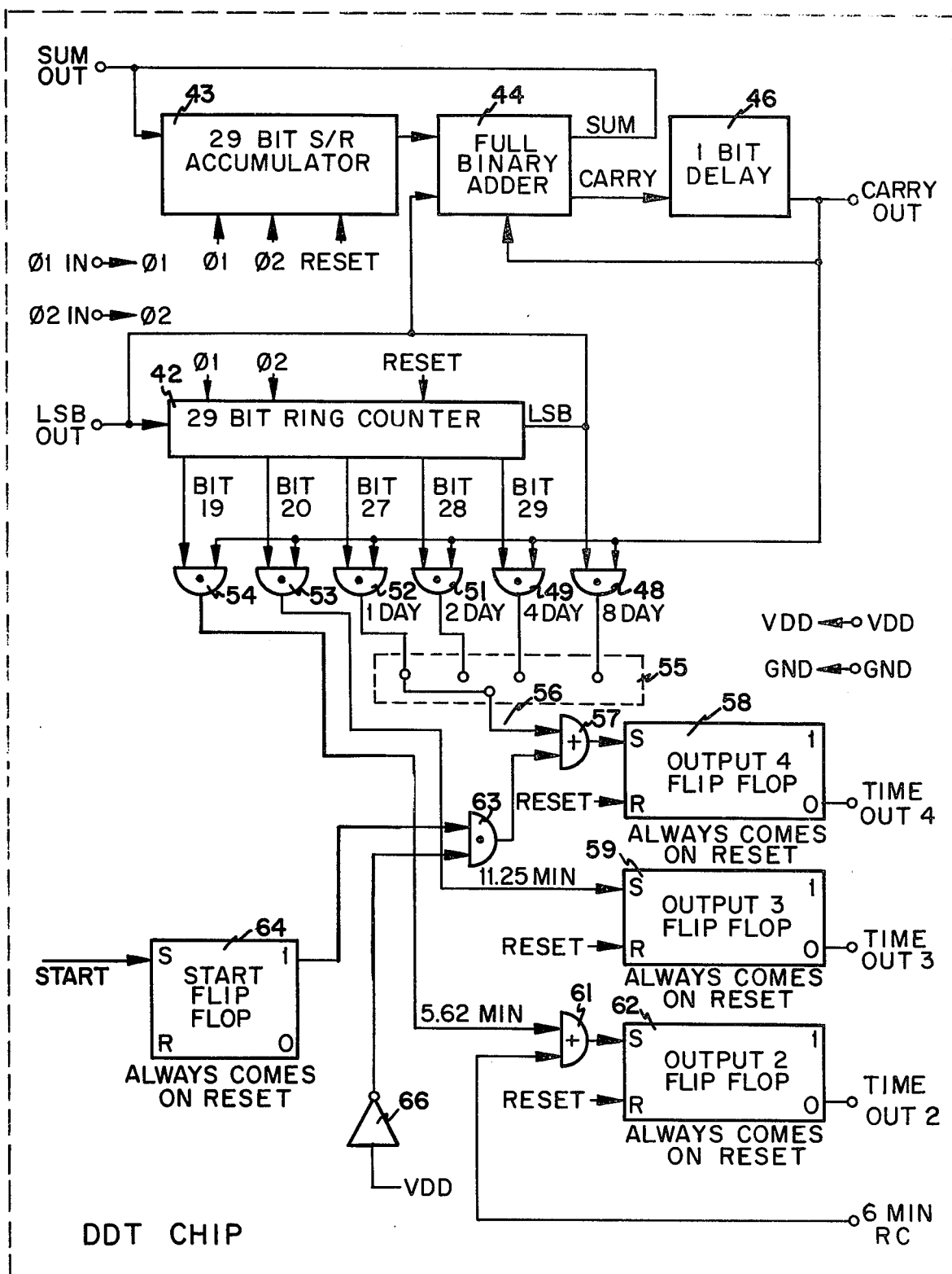
FIG. 2 is a block diagram of circuitry which may be manufactured on an integrated circuit chip.
Figure 3:
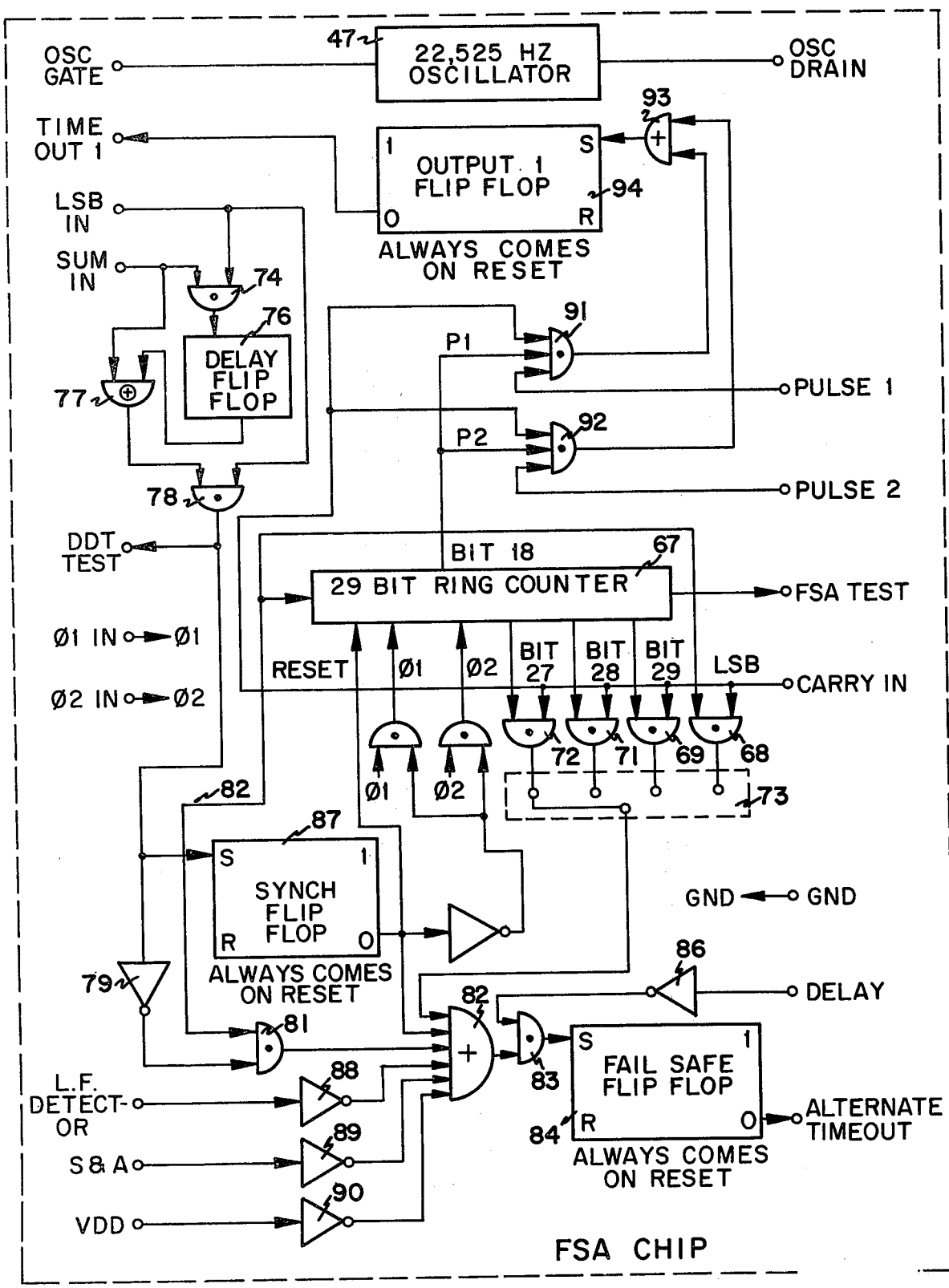
FIG. 3 is a block diagram of a second set of circuits which may be manufactured on an integrated circuit chip which when connected to the circuit of FIG. 2 provides the system shown in FIG. 1.

Referring now to FIGS. 2 and 3 taken together we see a specific example of the system shown in FIG. 1. In this system a 29 bit ring counter 42 and a 29 bit shift register accumulator 43 is substituted for the N bit ring counter 14 and the N bit shift register accumulator 16 respectively. A full binary adder 44 and a one bit delay circuit 46 completes the multiplier circuit. A 22,525 Hertz oscillator 47 drives the 29 bit ring counter 42 and the 29 bit shift register accumulator 43 so that an "And" gate 48 connected between the output of the one bit delay 46 and the last stage of the 29 bit ring counter 42 will provide an output pulse after an interval of 8 days. In a like manner, an "And" gate 49 connected to the 28th bit of the 29 bit ring counter 42 and the one bit delay 46 provides an output pulse after 4 days. Similarly, "And" gates 51, 52, 53, and 54 are connected to appropriate stages of the 29 bit ring counter 42 and the one bit delay 46 to provide output pulses after intervals of 2 days, 1 day, 11.25 minutes, and 5.62 minutes.

In this embodiment a terminal strip 55 is provided so that the desired output from the "And" gates 48, 49, 51, and 52 providing 1, 2, 4, and 8 day delayed pulses can be internally connected to an input terminal 56 of an "or" gate 57 during manufacture. The "or" gate 57 drives an output 4 flip flop 58 which corresponds to the output flip flop 37 in FIG. 1. The output from the "or" gate 53 is connected to drive an ouput 3 flip flop 59 which provides a level signal 11.25 minutes after the counting has begun. The output 3 flip flop can be employed to perform many delayed functions; it is merely being shown to illustrate the flexibility of this system.

The output of the "And" gate 54 drives one input of an "or" gate 61. The "or" gate 61 drives an output 2 flip flop 62 which in turn is connected to the input marked "delay" in FIG. 3. A second input to the "or" gate 61 is provided by an RC circuit (not shown) which triggers the flip flop 62 after 6 minutes if the 5.62 minute pulse does not arrive. This signal is employed to inhibit detonation of the fuze due to a malfunction for at least 5.62 minutes. An "And" gate 63 provides a second input signal to the "or" gate 57. The "And" gate 63 is driven by a start flip flop 64 and a low voltage detector 66. The start flip flop 64 inhibits the "And" gate 63 to prevent firing before the start of a sequence while the low voltage detector will provide a signal through the "And:" gate 63; "or" gate 57 to the output 4 flip flop 58 to detonate the ordnance device should the power supply drop below a predetermined level.

In this embodiment, a second 29 bit ring counter runs in synchronism with the 29 bit ring counter 42 to insure that an output pulse is received even if one of the gates 48, 49, 51 or 52 should fail. Therefore, redundant gates 68, 69, 71, and 72 are provided along with a redundant terminal strip 73. The 29 bit ring counter 67 is also used to insure that the 29 bit ring counter 42 and the 29 bit shift register accumulator 43 are operating properly.

This is accomplished by connecting the sum out-terminal in FIG. 2 to the sum in-terminal in FIG. 3 and the LSB out-terminal in FIG. 2 to the LSB in-terminal in FIG. 3. These signals are applied to an "And" gate 74 and from there to a delay flip flop 76. The output from the delay flip flop 76 is applied with the sum-in input to an exclusive "or" circuit 77. The LSB "in" signal is applied to an "And" gate 78. The output from the exclusive "or" circuit is a second input to the "And" gate 78. This combination of logic circuitry will provide a signal indicating operation of the circuitry including the 29 bit ring counter 42 and the 29 bit shift register accumulator 43.

The output of the "And" gate 78 is inverted by inverter 79 and applied as a first input to an "And" gate 81. The signal from the last stage of the 29 bit ring counter 67 is applied by a lead 82 as a second input to the "And" gate 81. If either the 29 bit ring counter 67 or the circuitry including the 29 bit ring counter 42 and the 29 bit shift register accumulator 43 are not properly operating, the "And" gate 81 will provide a signal to an "or" gate 82 which drives an "And" gate 83. The "And" gate 83 operates a fail-safe flip flop 84 which is connected ultimately to operate the ordnance device.

The output of the output 2 flip flop 62 discussed before is connected to the delay input to the circuit in FIG. 3. This signal is inverted by an inverter 86 and serves as a second input to the "And" gate 83 to prevent operation of the fail-safe flip flop for the time-out interval. The output from the logic circuitry terminating with the "And" gate 78 drives a synch flip flop 87. The output of the synch flip flop 87 is employed to reset the 29 bit ring counter 67 and gate the timing signals thereto. In this way, coordinating the 29 bit ring counter 67 with the 29 bit ring counter 42. The output of the synch flip flop 87 is also applied to the "or" gate 82 to operate the fail-safe device if no signal is received from the circuitry including the 29 bit ring counter 42 and the 29 bit register accumulator 43.

Three inverters 88, 89, and 90 also drive inputs of the "or" gate 82. The inverter 88 is responsive to a low frequency detector which triggers the ordnance device if the oscillator 47 has a frequency which is too low. The inverter 89 is triggered by a safety and arming device while the inverter 90 operates if the voltage supplied to the circuitry drops below a predetermined level.

Additional logic circuitry including "And" gates 91 and 92, "or" gate 93, and an output 1 flip flop 94 is included to shown additional functions which can be performed with a system of this invention. A pair of pulses are applied on terminals pulse 1 and pulse 2 from a source not shown. A timing signal from the 29 bit ring counter 66 is applied also to the "And" gate 91 and 92. The carry signal also drives the "And" gates 91 and 92. Therefore, if a carry occurs in coincidence with a predetermined time of the 29 bit ring counter and one of the external pulses; pulse 1 or pulse 2, a signal is provided by the "or" gate 93 to trigger the output 1 flip flop 94. The output 1 flip flop 94 can be employed to drive additional circuitry.

It should be understood that this embodiment is merely illustrative of the principles of this invention and that numerous others can be devised by those skilled in the art in light thereof.

What is claimed is:

1. A time delay circuit including:
   a first shift register having an input and an output;
   a second shift register having an input and an output;
   means for connecting said input of said first shift register to said output thereof;
   a full binary adder having first, second and third inputs, a sum output and a carry output;
   means for connecting said output of said second shift register to said first input of said full binary adder;
   means for connecting said sum output to said input of said second shift register;
   means for connecting said output of said first shift register to said second input of said full binary adder;
   delay means for connecting said carry output to said third input of said binary full adder;
   an "And" gate having first and second inputs;
   means for connecting said output of said first shift register to said first input of said "And" gate; and
   means for connecting said third input of said binary full adder to said second input of said "And" gate.

2. The time delay circuit as defined in claim 1 in which said first and second shift registers have an equal number of stages.

3. The time delay circuit as defined in claim 2 in which information in said first and second shift registers are advanced at a predetermined bit interval; and said delay means is one bit interval long.

4. The time delay circuit as defined in claim 1 also including:
   means for inserting a "1" in one stage of said first shift register.

5. The time delay circuit as defined in claim 4 also including:
   a preset capability; and
   means for remotely supplying a coded signal to the input of the second shift register.

6. The time delay circuit as defined in claim 5 also including:
   a third "And" gate having first and second inputs;
   means for connecting said output of said first shift register to said first input of said third "And" gate; and
   means for connecting said sum output of said full binary adder to said second input of said third "And" gate;
   a delay flip flop having an input and an output;
   means for connecting said output of said third "And" gate to said input of said delay flip flop;

an "exclusive-or" gate having first and second inputs;
means for connecting said sum output of said full binary adder to first input of said "exclusive-or" gate; and means for connecting said output of said delay flip flop to said second input of said "exclusive-or" gate;
a fourth "And" gate having first and second inputs;
means for connecting said output of said "exclusive-or" gate to said first input of said fourth "And" gate; and means for connecting said output of said first shift register to said second input of said fourth "And" gate.

7. The time delay circuit as defined in claim 1 also including:
a second "And" gate having first and second inputs;
means for connecting said third input of said binary full adder to said first input of said second "And" gate; and
means for connecting an intermediate stage of said first shift register to said second input of said second "And" gate.

8. The time delay circuit as defined in claim 7 also including:
an output flip flop; and
means for selectively connecting said first and second "And" gates to said flip flop.

9. The time delay circuit as defined in claim 8 also including:
a third "And" gate having first and second inputs;
means for connecting said output of said first shift register to said first input of said third "And" gate; and
means for connecting said sum output of said full binary adder to said second input of said third "And" gate;
a delay flip flop having an input and an output;
means for connecting said output of said third "And" gate to said input of said delay flip flop;
an "exclusive-or" gate having first and second inputs;
means for connecting said sum output of said full binary adder to first input of said "exclusive-or" gate; and means for connecting said output of said delay flip flop to said second input of said "exclusive-or" gate;
a fourth "And" gate having first and second inputs;
means for connecting said output of said "exclusive-or" gate to said first input of said fourth "And" gate; and means for connecting said output of said first shift register to said second input of said fourth "And" gate.

* * * * *